(12) United States Patent
Erhart et al.

(10) Patent No.: US 9,413,086 B2
(45) Date of Patent: Aug. 9, 2016

(54) COST OPTIMIZED CELL VOLTAGE TAP-OFF CONNECTION

(71) Applicant: SAMSUNG SDI CO., LTD., Yongin-si, Gyeonggi-do (KR)

(72) Inventors: Michael Erhart, Hart bei Graz (AT); Uwe Geidl, Grartkorn (AT); Martin Hafellner, Mürzhofen (AT); Thomas Korherr, Hartberg (AT)

(73) Assignee: Samsung SDI Co., Ltd., Yongin-si (KR)

( * ) Notice: Subject to any disclaimer, the term of this patent is extended or adjusted under 35 U.S.C. 154(b) by 111 days.

(21) Appl. No.: 13/871,044

(22) Filed: Apr. 26, 2013

(65) Prior Publication Data
US 2013/0288544 A1 Oct. 31, 2013

(30) Foreign Application Priority Data
Apr. 27, 2012 (EP) .................................. 12166004

(51) Int. Cl.
*H01R 11/00* (2006.01)
*H01R 11/28* (2006.01)
(Continued)

(52) U.S. Cl.
CPC .......... *H01R 11/281* (2013.01); *G01R 31/3696* (2013.01); *H01M 2/202* (2013.01);
(Continued)

(58) Field of Classification Search
CPC ... H01M 2/202; H01M 10/48; H01M 10/425; H01M 10/482; H01M 2010/4271; H01R 13/62; H01R 25/16; H01R 11/281; H01R 11/285; H01R 11/288; H01R 11/24; H01R 12/526; H01R 12/707; H01R 43/0235; H01R 43/0256; H01R 4/625; G01R 31/3696; H02B 1/20

USPC ................... 439/754, 212, 756, 504, 83, 627; 429/123

See application file for complete search history.

(56) References Cited

U.S. PATENT DOCUMENTS

| | | | | | |
|---|---|---|---|---|---|
| 4,156,552 A | * | 5/1979 | Wilson | .................. | H01M 2/202 439/281 |
| 4,657,335 A | * | 4/1987 | Koch | .................. | H01R 13/187 349/851 |

(Continued)

FOREIGN PATENT DOCUMENTS

| DE | 102009043858 A1 | 3/2010 | | |
|---|---|---|---|---|
| DE | WO 2010142679 A1 | * 12/2010 | ............ | H01M 2/202 |

(Continued)

*Primary Examiner* — Neil Abrams
*Assistant Examiner* — Travis Chambers
(74) *Attorney, Agent, or Firm* — Lewis Roca Rothgerber Christie LLP

(57) ABSTRACT

A voltage tap element configured to tap off the voltage of a battery cell of a battery unit by an electronics unit, a cell supervisory unit having such voltage tap elements, and a battery unit having such a cell supervisory unit, and methods for producing the cell supervisory unit and the battery unit. The voltage tap element is designed as a clip composed of a first metal, with a first end of the clip having a first contact region which establishes a operative connection to the electronics unit, and a second end of the clip having a second contact region for establishing a connection to the battery cell. In the first contact region, the clip is permanently connected to an intermediate piece which is composed of a second metal which differs from the first metal. The intermediate piece is configured for operative connection to the electronics unit by a solder connection using SMD technology.

20 Claims, 10 Drawing Sheets

(51) Int. Cl.

| | |
|---|---|
| *G01R 31/36* | (2006.01) |
| *H01M 10/42* | (2006.01) |
| *H01M 10/48* | (2006.01) |
| *H01R 13/62* | (2006.01) |
| *H01R 43/02* | (2006.01) |
| *H01M 2/20* | (2006.01) |
| *H01R 4/62* | (2006.01) |

(52) U.S. Cl.
CPC ............ *H01M10/425* (2013.01); *H01M 10/48* (2013.01); *H01M 10/482* (2013.01); *H01R 11/288* (2013.01); *H01R 13/62* (2013.01); *H01R 43/02* (2013.01); *H01M 2010/4271* (2013.01); *H01R 4/625* (2013.01)

(56) References Cited

U.S. PATENT DOCUMENTS

| | | | | |
|---|---|---|---|---|
| 4,734,063 | A * | 3/1988 | Koch | H01R 13/187 439/844 |
| 5,017,859 | A * | 5/1991 | Engel et al. | 324/127 |
| 5,496,657 | A * | 3/1996 | Dixon, Jr. | 429/62 |
| 5,901,046 | A * | 5/1999 | Ohta et al. | 361/760 |
| 5,929,600 | A | 7/1999 | Hasegawa | |
| 7,462,417 | B2 * | 12/2008 | Moon | 429/90 |
| 7,775,810 | B2 * | 8/2010 | Lawrence et al. | 439/121 |
| 8,574,008 | B2 * | 11/2013 | Große | H01M 2/202 439/627 |
| 8,690,598 | B2 * | 4/2014 | Bolouri-Saransar et al. | 439/404 |
| 8,691,412 | B2 * | 4/2014 | Yonishi | H01M 2/105 429/100 |
| 2002/0182929 | A1 * | 12/2002 | Chang | H01M 10/4257 439/500 |
| 2003/0162436 | A1 * | 8/2003 | Nakagawa | 439/500 |
| 2005/0031945 | A1 * | 2/2005 | Morita | H01M 2/202 429/158 |
| 2006/0032667 | A1 * | 2/2006 | Sato | B23K 11/004 174/260 |
| 2008/0057799 | A1 * | 3/2008 | Pereira | 439/876 |
| 2008/0213652 | A1 * | 9/2008 | Scheucher | B60L 8/00 429/62 |
| 2010/0073005 | A1 * | 3/2010 | Yano et al. | 324/427 |
| 2010/0124693 | A1 * | 5/2010 | Kosugi | G01R 31/3644 429/92 |
| 2010/0255355 | A1 * | 10/2010 | Park | H01M 2/105 429/91 |
| 2011/0287641 | A1 * | 11/2011 | Zhu | 439/83 |
| 2012/0100744 | A1 * | 4/2012 | Bolouri-Saransar et al. | 439/404 |
| 2012/0208410 | A1 * | 8/2012 | Ikeda | H01M 2/206 439/883 |
| 2013/0202919 | A1 * | 8/2013 | Hwang | H01M 2/202 429/7 |
| 2013/0224532 | A1 * | 8/2013 | Bengtsson | H01M 2/1072 429/7 |
| 2014/0315060 | A1 * | 10/2014 | Fauland | H01M 10/425 429/90 |
| 2014/0322574 | A1 * | 10/2014 | Kropsch | H01M 2/206 429/90 |

FOREIGN PATENT DOCUMENTS

| | | |
|---|---|---|
| DE | 102010022689 A1 | 12/2011 |
| EP | 2416435 A1 | 2/2012 |
| WO | WO 2010142679 A1 * 12/2010 | ............ H01M 2/20 |

\* cited by examiner

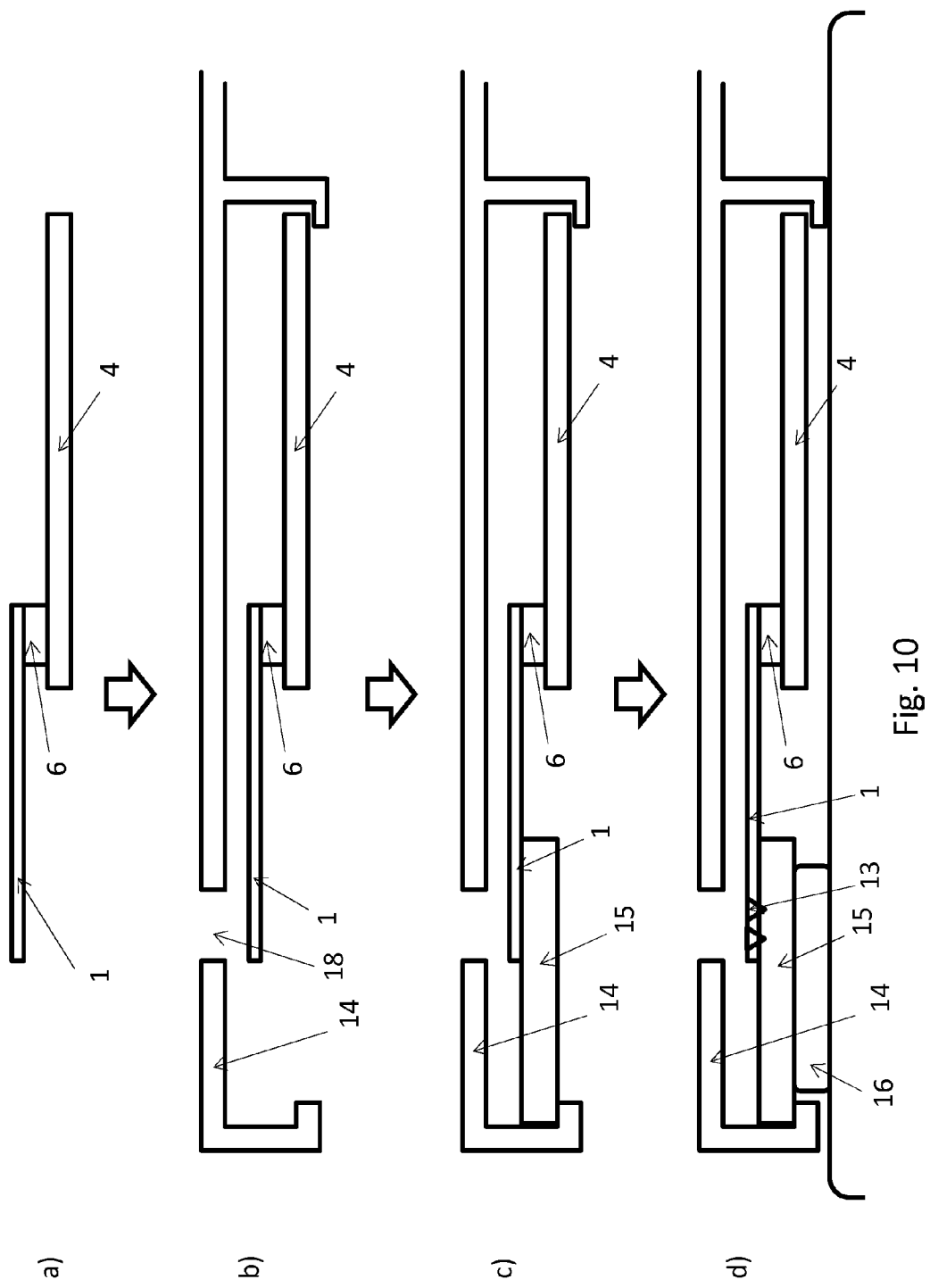

COST OPTIMIZED CELL VOLTAGE TAP-OFF CONNECTION

CROSS-REFERENCE TO RELATED APPLICATIONS

The present application claims priority 35 U.S.C. §119 to European Patent Application No. 12 166 004.7 (filed on Apr. 27, 2012), which is hereby incorporated by reference in its entirety.

TECHNICAL FIELD

Embodiments relate to a voltage tap element configured to tap off the voltage of a battery cell of a battery unit by an electronics unit. Embodiments also relate to a cell supervisory unit including an electronics unit and a plurality of voltage tap elements, and to a method for producing such a cell supervisory unit. Embodiments relate to a battery unit having a cell supervisory unit, and to a method for producing a battery unit having a cell supervisory unit.

BACKGROUND

Certain apparatuses are used, as is known, to monitor the voltages of individual cells of a battery unit by an electronics unit, in particular, by a cell supervisory circuit (CSC). As a result, it is possible to identify, for example, the state of charge of the battery cells and to perform charge compensation of the cells.

Copper cables are usually used for the voltage tap itself, that is to say the connection between the cells or the cell poles or cell connectors on the one hand and the electronics unit on the other. Methods for establishing the contacts between the copper cables and the battery cell, for example, screwing or clamping, are known, but require complicated manufacture. Since a large number of cells usually have to be inserted into a battery unit in order to achieve relatively high voltages, the problem of correctly connecting a large number of copper cables between the cells and the associated connection points of the electronics unit also arises. Accordingly, the production of cell supervisory units and of battery units having cell supervisory units of this kind by cable connections is complicated and susceptible to faults.

SUMMARY

In accordance with embodiments, voltage tap elements, cell supervisory units having such voltage tap elements, and battery units having such cell supervisory units are respectively provided, and particularly, each having enhanced designs, such that simple and cost-effective production of the cell supervisory units and the battery units having such cell supervisory units is possible with a low level of susceptibility to faults.

In accordance with embodiments, provided is correspondingly simple, cost-effective methods for producing cell supervisory units and battery units having such cell supervisory units with a low level of susceptibility to faults.

In accordance with embodiments, a voltage tap element configured to tap off the voltage of a battery cell of a battery unit by an electronics unit, in which the voltage tap element is designed as a clip composed of a first metal, a first end of the clip having a first contact region configured to establish an operative connection to the electronics unit. In the first contact region, the clip is permanently connected to an intermediate piece composed of a second metal which differs from the first metal and which is configured to be soldered using SMD technology. The intermediate piece is configured for operative connection to the electronics unit by a solder connection using SMD technology. The second end of the clip has a second contact region configured to establish an operative connection to the battery cell.

In accordance with embodiments, a cell supervisory unit includes an electronics unit and a plurality of voltage tap elements, in which the voltage tap elements are configured for operative connection by soldering to the electronics unit by way of their respective intermediate pieces using SMD technology.

In accordance with embodiments, a method for producing such a cell supervisory unit includes soldering voltage tap elements onto the electronics unit at their respective intermediate pieces using SMD technology.

In accordance with embodiments, a battery unit includes a cell supervisory unit having an electronics unit and a plurality of voltage tap elements, each voltage tap element including (i) a clip composed of a first metal, the clip having a first end with a first contact region configured to establish an operative connection to the electronics unit, and a second end with a second contact region configured to establish an operative connection to a battery cell; and (ii) an intermediate piece composed of a second metal which differs from the first metal, and which is permanently connected to the clip at the first contact region and configured to be operatively connected to the electronics unit using SMD technology.

In accordance with embodiments, a method for producing a battery unit having a cell supervisory unit includes at least one of the following: inserting the cell supervisory unit with premounted voltage tap elements into a housing; inserting cell connectors into the housing, so that the cell connectors are each in contact with the second contact regions of the voltage tap elements of the cell supervisory unit; placing the housing containing the cell supervisory unit and the cell connectors onto the battery unit, so that the cell connectors are in contact with cell poles of the battery unit; and then welding the cell connectors to the cell poles and the second contact regions of the voltage tap elements to the cell connectors.

In accordance with the invention, a clip is provided between an electronics unit and battery cells in order to establish the operative connection. In this case, a clip has a greater stiffness than cables, so that the clip maintains its position, in particular even after being mounted on the electronics unit, this making assignment to the suitable cells or cell connectors substantially easier.

In accordance with embodiments, the clip is produced from a first metal in order to ensure that it can be easily connected to the cells, in particular to cell connectors, which are preferably composed of the same material, in particular by welding. The clip has to be electrically conductive.

In accordance with embodiments, at one end, the clip is permanently connected to an intermediate piece which is composed of a second metal which is different from the first metal, and which second metal has to be able to be soldered using SMD technology. This intermediate piece ensures that the voltage tap element in accordance with the invention can be premounted on the electronics unit using SMD technology. The intermediate piece is suitably designed for this purpose, that is to say, for example, has substantially flat dimensions of small surface area.

In accordance with embodiments, the clip is preferably composed of aluminium. Aluminium has a low weight and is highly electrically conductive. In addition, the cell poles and/or cell connectors are advantageously also produced from aluminium and can therefore be easily welded to an aluminium clip. As an alternative, the clip can also be produced, for example, from steel.

In accordance with embodiments, the intermediate piece is preferably composed of copper, so that it can be easily soldered to lines or contact regions of the electronics unit, which lines or contact regions are usually likewise produced from copper. As an alternative, the intermediate piece can also be composed of other materials which can be soldered, for example from nickel, zinc, tin and the alloys thereof, for example, brass or bronze.

In accordance with embodiments, the metal of the intermediate piece, which metal may be soldered using SMD technology, is preferably tin-plated for the purpose of further improving the ability to solder.

In accordance with embodiments, the intermediate piece is connected to the clip by plating, in particular by roll-plating. This ensures that the intermediate piece is reliably and permanently fitted on the clip.

In accordance with embodiments, the central part of the clip preferably has a reduced cross section in relation to the contact regions, in particular a reduced width of the clip. This provides good conductivity and a reduced material requirement.

In accordance with embodiments, the central part of the clip particularly preferably has at least one curvature or an offset or a bent portion, in particular, the central part of the clip can be designed in a U-shape or S-shape. Tolerance compensation between the electronics unit and the cells is provided by these shaped portions of the clip which increase the elasticity thereof. The vibrational loading on weld or solder points between the clip and the cells or the clip and the electronics unit is also reduced as a result.

In accordance with embodiments, the central part of the clip has a retaining projection. This projection provides a good contact area for tools during manufacture, in particular when the clip is joined to cell connectors and/or the electronics unit.

In accordance with embodiments, the central part of the clip can also preferably have a vertical bent portion as a positioning aid. In this case, vertical is understood to mean normal to the contact areas of the clip. When a voltage tap element is soldered onto an electronics unit, the voltage tap element is advantageously placed on a prefabricated receiving plate for the purpose of correct positioning. The receiving plate has corresponding notches for receiving the vertical bent portions, so that alignment is ensured when the electronics unit is fitted with the voltage tap element in accordance with the invention.

In accordance with embodiments, at least one weld point, but preferably two or more weld points, is/are provided in the second contact region. To this end, the second contact region has to have enough space available for the weld points. In this case, a weld point serves for welding to a cell, in particular a cell connector or a cell pole. A plurality of weld points are advantageously found in the second contact region. In this way, a clip which has already been welded to a cell connector of a battery can be removed again, for example by removal by milling, when swarf is removed by suction, and the same clip can be welded to another cell connector at a further weld point. This is particularly advantageous when the voltage tap elements are premounted on an electronics unit since, as a result, the entire arrangement comprising electronics unit and voltage tap elements can be removed from a battery unit, for example when said arrangement is defective, and can be replaced by another arrangement according to the invention of this kind.

In accordance with embodiments, a cell supervisory unit includes an electronics unit and a plurality of voltage tap elements, in which the voltage tap elements are connected by a soldering to the electronics unit by way of their intermediate pieces using SMD technology.

In accordance with embodiments, the electronics unit is preferably a cell supervisory circuit (CSC) and therefore usually accommodates a processor which is designed for monitoring purposes and usually also for controlling the cell voltages.

In accordance with embodiments, the electronics unit is a connection printed circuit board which can be connected to a cell supervisory circuit (CSC). In this case, the printed circuit board of the electronics unit accommodates only the required connection channels which lead from the contacts with the voltage tap elements to a connection for, for example, a further electronics unit which accommodates the processor.

In accordance with embodiments, a method for producing a battery unit having a cell supervisory unit includes at least one of: inserting the cell supervisory unit with premounted voltage tap elements into a housing; inserting cell connectors into the housing, so that the cell connectors are each in contact with the second contact regions of the voltage tap elements of the cell supervisory unit; placing the housing containing the cell supervisory unit and the cell connectors onto the battery unit, so that the cell connectors are in contact with cell poles of the battery unit; and then welding the cell connectors to the cell poles, and the second contact regions of the voltage tap elements to the cell connectors.

In accordance with embodiments, a cell supervisory unit which includes the electronics unit and clips which are soldered to it is first produced. This cell supervisory unit can be acquired from a supplier, for example, in a prefabricated manner and can be further processed as a finished unit.

In accordance with embodiments, the cell supervisory unit and the cell connectors may be inserted into the housing of the cell supervisory unit, for example, by being clipped in, since the components are preferably held in position in the housing by shaped portions of the housing and/or by further components.

In accordance with embodiments, after the cell supervisory unit and the cell connectors are inserted, the housing is usually vertically rotated through 180 degrees, so that the cell connectors come to rest at the bottom.

In accordance with embodiments, the cell supervisory unit in its housing is then mounted on the battery unit, that is to say on battery cells by way of their respective cell poles. This is followed by the cell poles then being welded to the cell connectors, and subsequently, the cell connectors being welded to the voltage tap elements, that is to say the contact regions of the clip. As an alternative, it is possible to provide openings in the upper face of the housing in this case, it being possible for welding to be performed from the other side of the housing through said openings.

In accordance with embodiments, a method for producing a battery unit having a cell supervisory unit having premounted voltage tap elements and an electronics unit and a plurality of voltage tap elements each voltage tap element including a clip composed of a first metal, the clip having a first end with a first contact region configured to establish an operative connection to the electronics unit, and a second end with a second contact region configured to establish an operative connection to a battery cell, and an intermediate piece composed of a second metal which differs from the first metal, and which is permanently connected to the clip at the first contact region and configured to be operatively connected to the electronics unit using SMD technology, the method including at least one of: inserting the cell supervisory unit into a housing; inserting cell connectors into the housing, so that the cell connectors are each in contact with the second contact regions of the voltage tap elements of the cell supervisory unit; placing the housing containing the cell supervisory unit and the cell connectors in the battery unit, so that the cell connectors are in contact with cell poles of the battery unit; and then welding the cell connectors to the cell poles, and the second contact regions of the voltage tap elements to the cell connectors.

DRAWINGS

In the text which follows, embodiments will be described, by way of example, referring to the drawings, in which.

FIGS. 10(a) to 10(d) illustrates a course of a method for producing a battery unit having a cell supervisory unit, in accordance with embodiments.

DESCRIPTION

Figure 1:
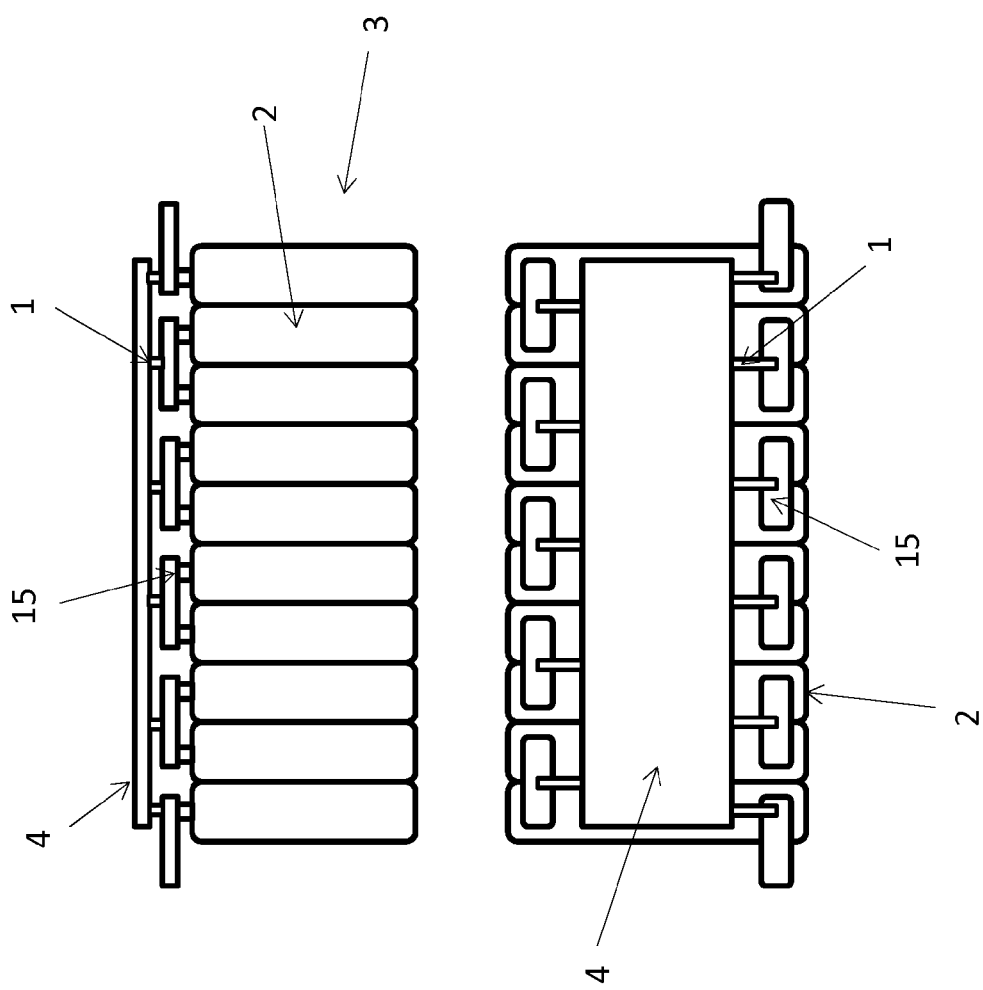
FIG. 1 is a schematic illustration, from the side and from above, of a battery unit in accordance with embodiments having a cell supervisory unit with voltage tap elements.
Figure 2:
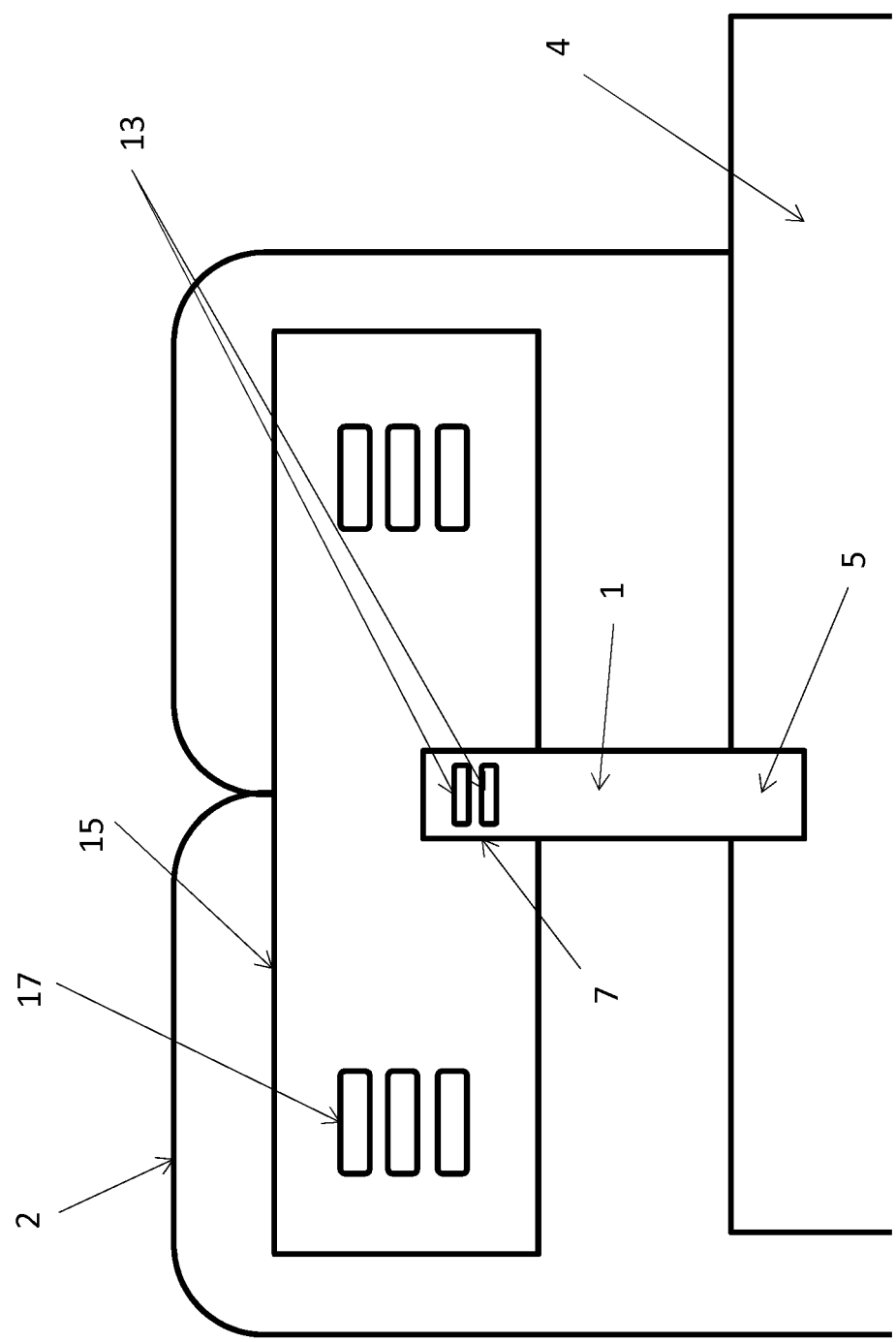
FIG. 2 is an illustration, from above, of a detail of a voltage tap element in relation to FIG. 1.

FIG. 1 is a schematic illustration, from the side (upper illustration) and from above (lower illustration), of a battery unit 3 in accordance with embodiments having a cell supervisory unit with voltage tap elements 1 and electronics unit 4. The battery unit 3 includes a plurality of battery cells 2. Cell poles are located at the upper end of the battery cells 2, and in each case two cell poles are operatively connected by cell connectors 15. The average voltage of the two battery cells 2 is drawn by the voltage tap elements 1 at the cell connectors 15.

As illustrated in accordance with embodiments of FIG. 2 to FIG. 9, each voltage tap element 1 includes a first contact region 5 configured to establish a solder connection to the electronics unit 4, and a second contact region 7 configured to establish a connection to a cell connector 15. Instead, the second contact region may also be directly operatively connected to a cell pole 16. Weld points 13 are provided for operatively connecting the voltage tap element 1 to a cell connector 15. For their part, the cell connectors 15 are welded to the cell poles by way of weld points 17.

Figure 3:
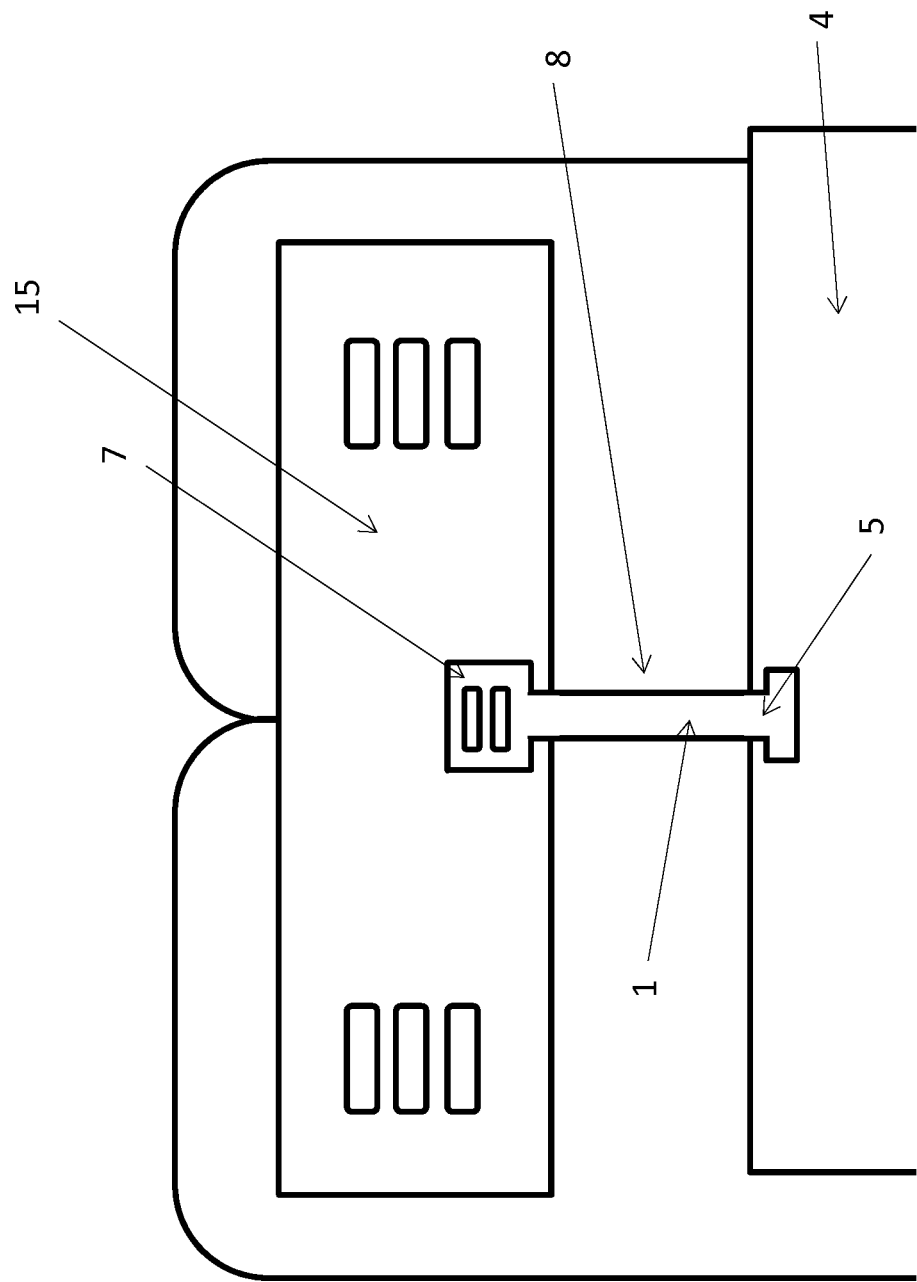
FIG. 3 is an illustration, from above, of a detail of an embodiment in relation to FIG. 1.
Figure 4:
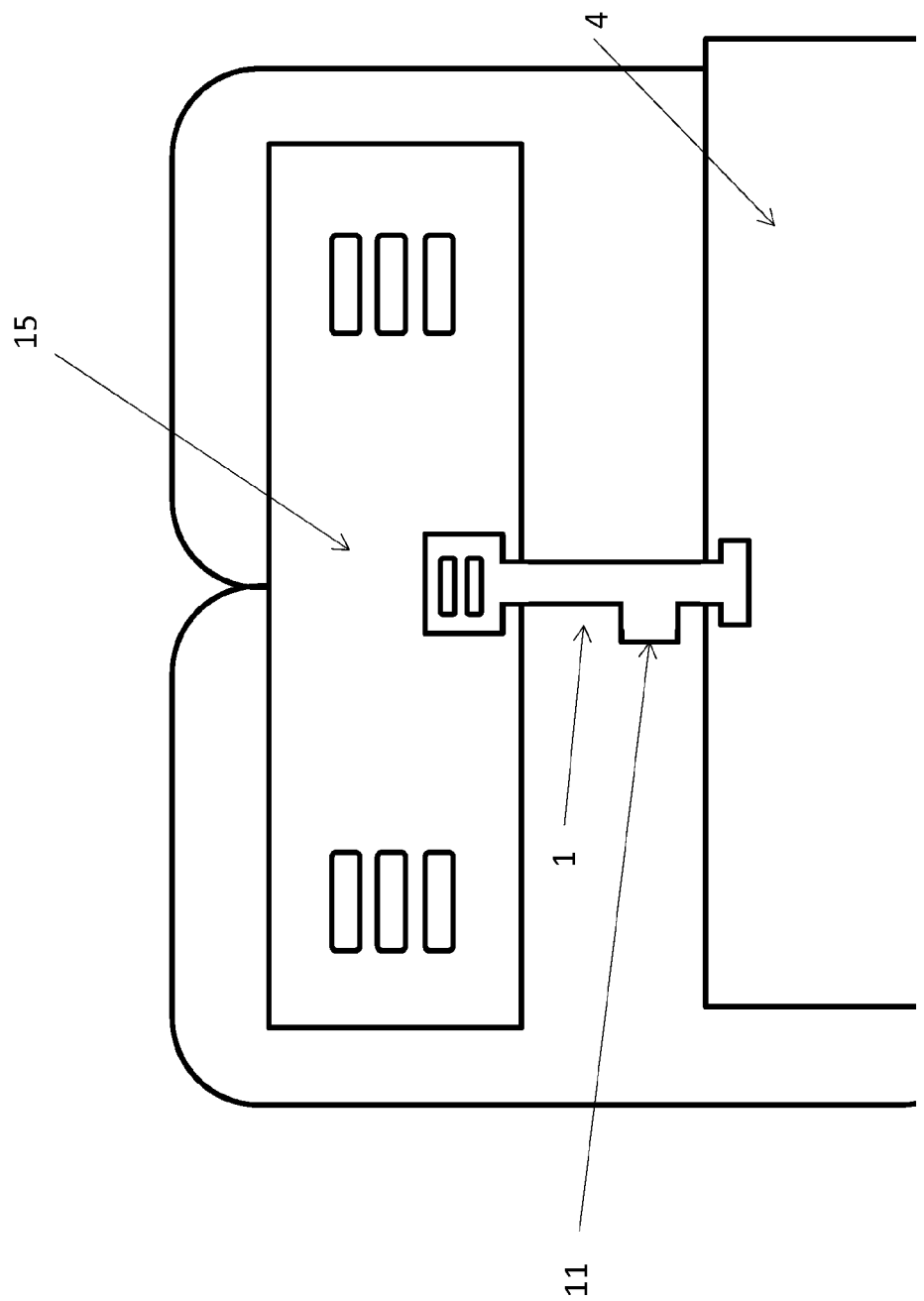
FIG. 4 is an illustration, from above, of a detail of an embodiment in relation to FIG. 1.
Figure 5:
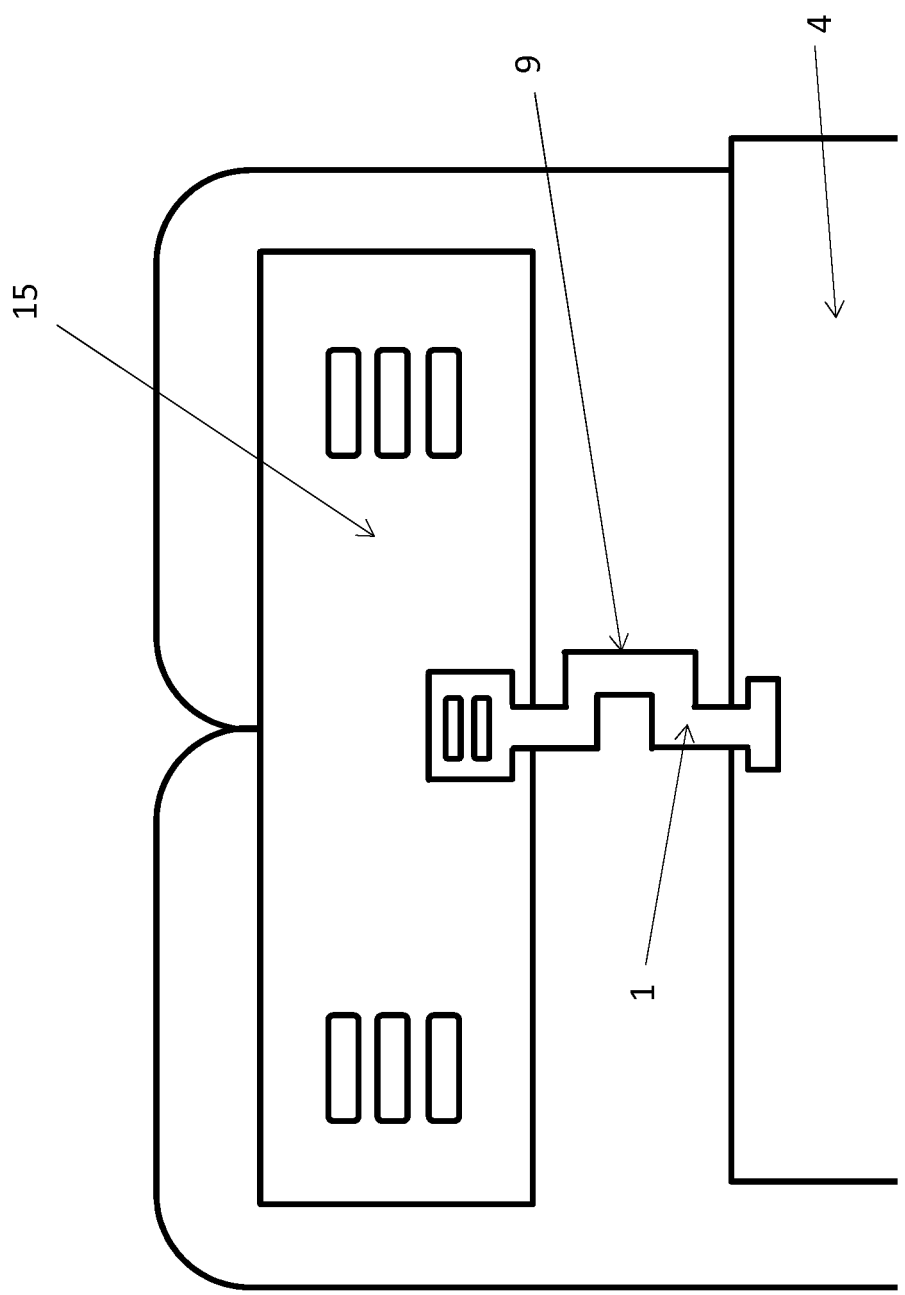
FIG. 5 is an illustration, from above, of a detail of an embodiment in relation to FIG. 1.
Figure 6:
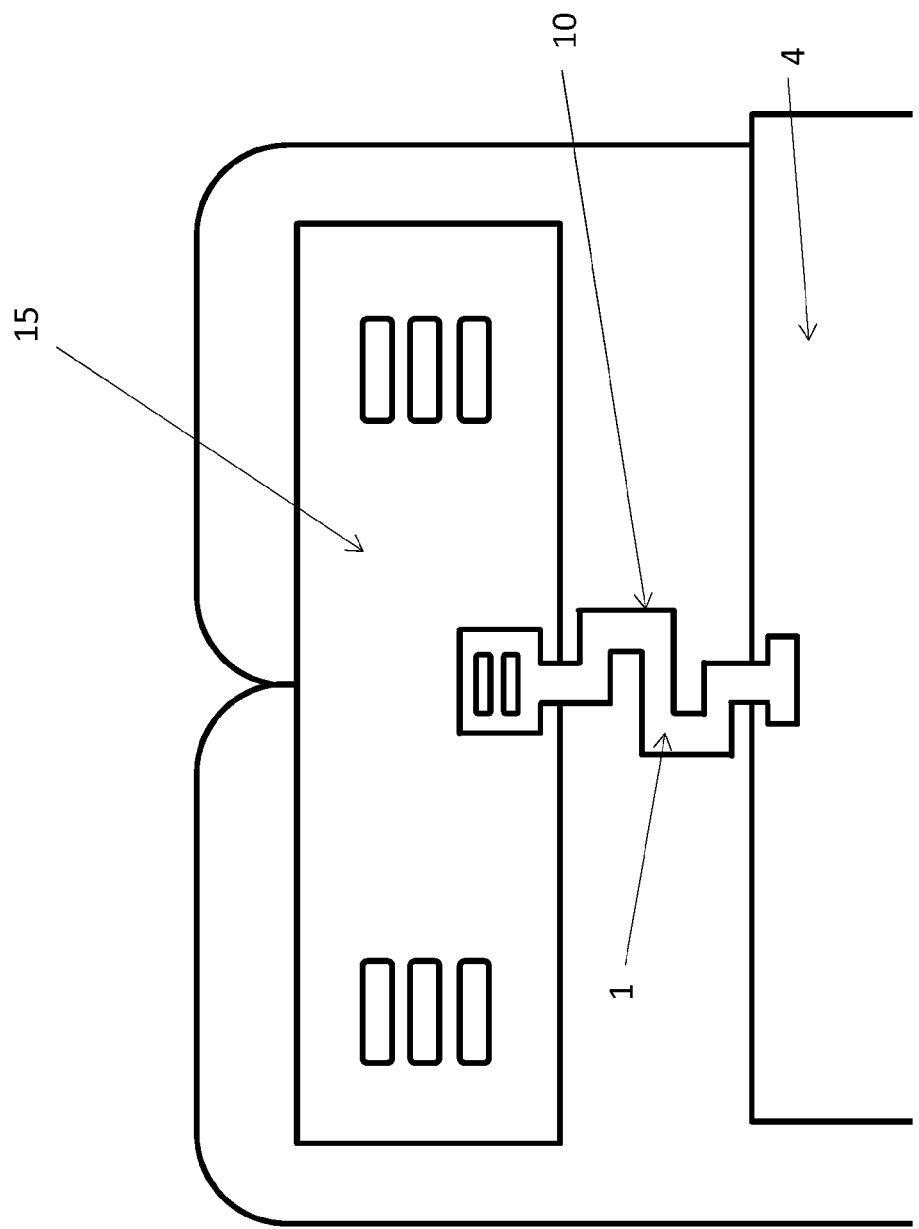
FIG. 6 is an illustration, from above, of a detail of an embodiment in relation to FIG. 1.
Figure 7:
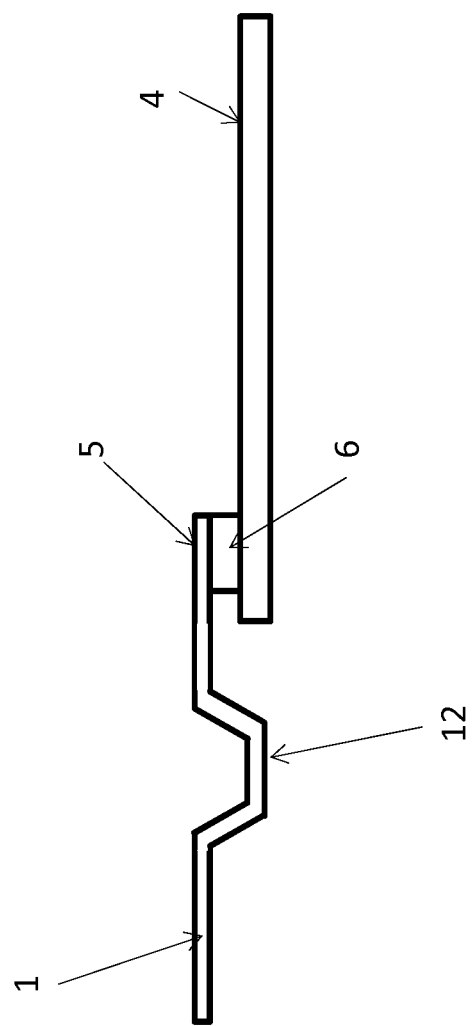
FIG. 7 is an illustration, from the side, of a detail of an embodiment in relation to FIG. 1.

The clip of the voltage tap element 1 usually has, in its central part, a smaller cross section 8, in particular a smaller width, than at its ends which are formed as contact regions, as illustrated in FIG. 3. This central part of the clip can have a retaining projection 11, see FIG. 4, on account of which handling of the component during manufacture is easier. Furthermore, the central part of the clip can, as illustrated in FIGS. 5 and 6, also have curvatures, for example, the illustrated approximate U-shape or S-shape. A vertical bent portion 12, see FIG. 7, makes it easier to align the clip during mounting of the electronics unit 4 when a suitable receiving plate for positioning purposes is used for this purpose.

Figure 8:
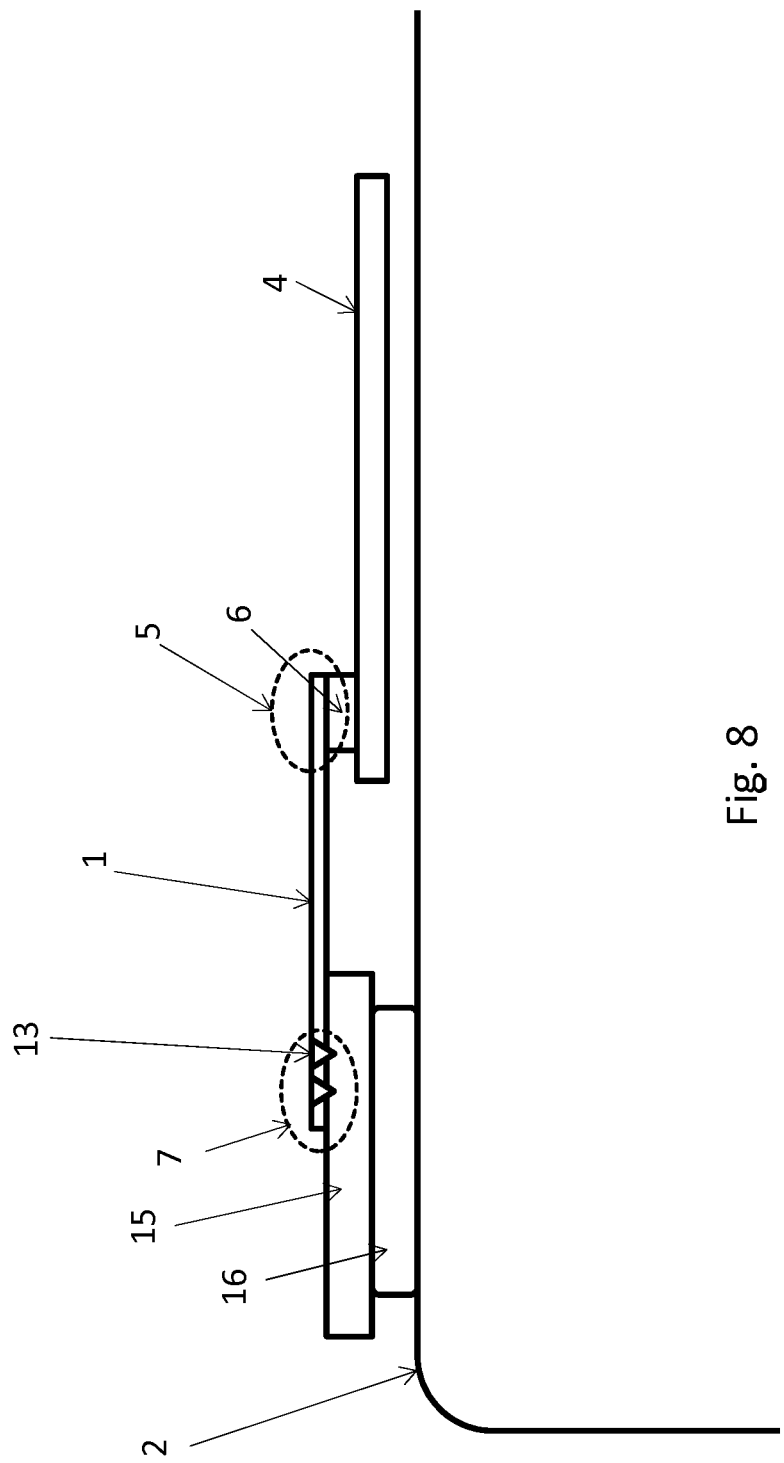
FIG. 8 is an illustration, from the side, of a detail of an embodiment in relation to FIG. 1.
Figure 9:
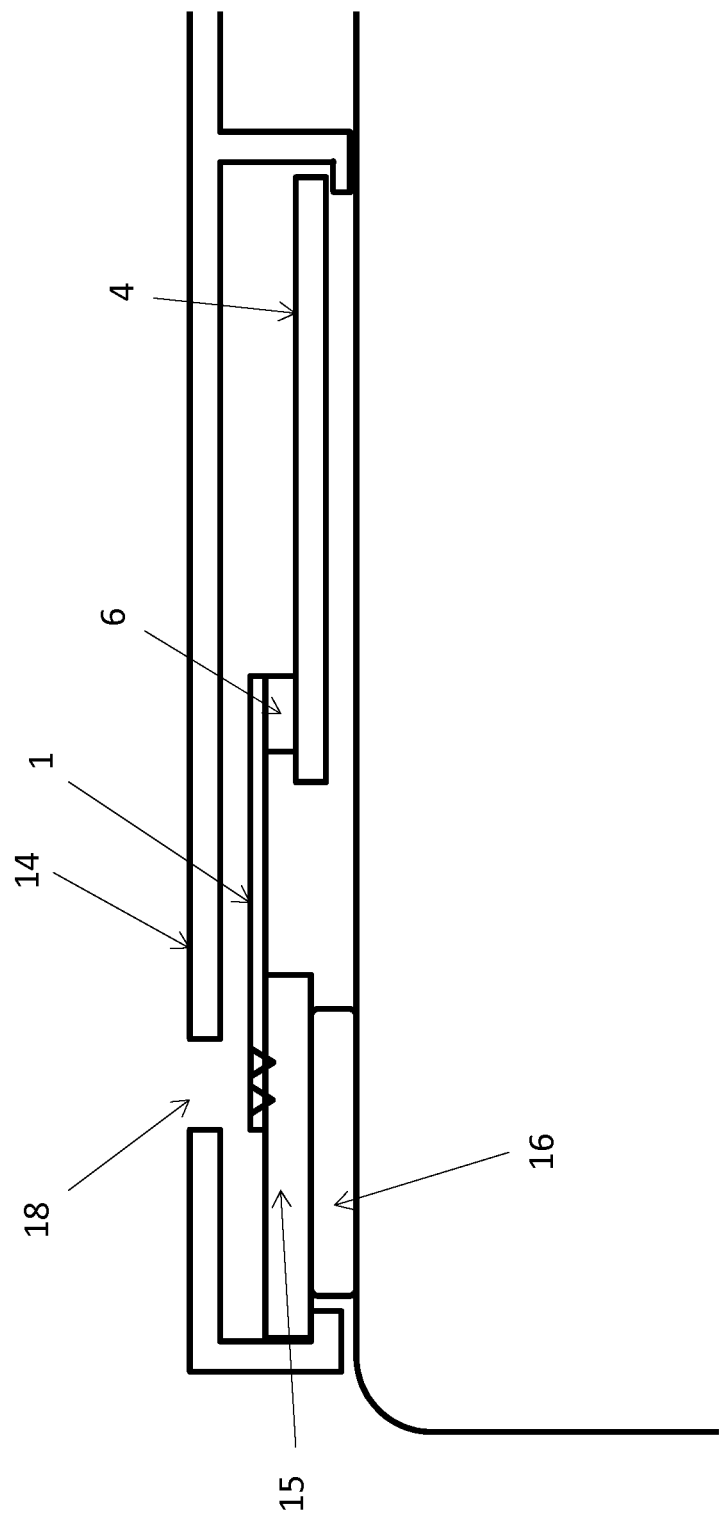
FIG. 9 is an illustration, from the side, of a detail of a further embodiment in relation to FIG. 1.

The illustration of a detail in FIG. 8 clearly illustrates the first and second contact regions 5, 7. An intermediate piece 6 is plated onto the clip of the voltage tap element 1 at the first contact region 5. This intermediate piece 6 allows the clip to be mounted on the electronics unit 4 using SMD technology.

The entire cell supervisory unit, which includes the electronics unit 4 and the voltage tap elements 1, is accommodated in a housing 14 which is fitted on the battery cells 2 of the battery unit 3.

FIGS. 10(a) to 10(d) finally illustrates a method for producing a battery unit 3 having a cell supervisory unit.

FIG. 10(a) illustrates the cell supervisory unit which is premounted with voltage tap elements 1. This unit is, as illustrated in FIG. 10(b), inserted into a housing 14. In FIG. 10(c), the cell connectors 15 are then pushed into the housing 14. The resulting unit is finally fitted onto the battery cells 2 by way of the cell poles 16 of the battery cells. The cell connectors 15 are then welded to the cell poles 16 and to the voltage tap elements 1.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

LIST OF REFERENCE SIGNS

1 Voltage tap element
2 Battery cell
3 Battery unit
4 Electronics unit
5 First contact region
6 Intermediate piece
7 Second contact region
8 Reduced cross section
9 U-shaped central part of the clip
10 S-shaped central part of the clip
11 Retaining projection
12 Vertical bent portion
13 Weld point
14 Housing
15 Cell connector
16 Cell pole
17 Weld point between cell connector and cell pole
18 Opening for welding

What is claimed is:

1. A voltage tap element configured to tap off the voltage of a battery cell of a battery unit via an electronics unit, the voltage tap element comprising:

a clip comprising a first metal, the clip having a first end with a first contact region and a second end with a second contact region, the second contact region being configured to establish an operative connection to the battery cell at a lower side of the clip; and an intermediate piece comprising a second metal which differs from the first metal, the intermediate piece contacting the clip at the first contact region at the lower side of the clip and configured to be operatively connected to the electronics unit using SMD technology.

2. The voltage tap element of claim 1, wherein the first metal is aluminium.

3. The voltage tap element of claim 1, wherein the second metal is copper.

4. The voltage tap element of claim 1, wherein the second metal of the intermediate piece is tin-plated.

5. The voltage tap element of claim 1, wherein the intermediate piece is operatively connected to the clip by roll-plating.

6. The voltage tap element of claim 1, wherein a central part of the clip has a reduced cross-section in relation to the first and second contact regions.

7. The voltage tap element of claim 1, wherein a central part of the clip has at least one of a curvature, an offset, or a bent portion.

8. The voltage tap element of claim 1, wherein a central part of the clip has a U-shape or an S-shape.

9. The voltage tap element of claim 1, wherein a central part of the clip has a retaining projection.

10. The voltage tap element of claim 1, wherein a central part of the clip has a vertical bent portion as a positioning aid.

11. The voltage tap element of claim 1, wherein at least one weld point is provided in the second contact region.

12. The voltage tap element of claim 1, wherein two or more weld points are provided in the second contact region.

13. A cell supervisory unit comprising:
an electronics unit; and
a plurality of voltage tap elements, each voltage tap element comprising:
a clip comprising a first metal, the clip having a first end with a first contact region configured to establish an operative connection to the electronics unit at a lower side of the clip, and a second end with a second contact region configured to establish an operative connection to a battery cell at the lower side of the clip; and
an intermediate piece comprising a second metal which differs from the first metal, the intermediate piece contacting the clip at the lower side thereof and configured to be operatively connected to the electronics unit using SMD technology,
wherein each voltage tap element is configured for operative connection to the electronics unit at the intermediate pieces using SMD technology.

14. The cell supervisory unit of claim 13, wherein the electronics unit is a cell supervisory circuit (CSC).

15. The cell supervisory unit of claim 13, wherein the electronics unit is a connection printed circuit board configured for operative connection to a cell supervisory circuit (CSC).

16. The cell supervisory unit of claim 13, wherein the first metal is aluminium and the second metal is copper.

17. The cell supervisory unit of claim 13, wherein the second metal of the intermediate piece is tin-plated.

18. The cell supervisory unit of claim 13, wherein the intermediate piece is operatively connected to the clip by roll-plating.

19. The cell supervisory unit of claim 13, wherein a central part of the clip has a reduced cross-section in relation to the first and second contact regions.

20. A battery unit comprising:
a plurality of battery cells;
a cell connector electrically connecting adjacent ones of the battery cells;
an electronics unit; and
a voltage tap element comprising:
a clip comprising a first metal, and having a first end along a length direction of the clip and a second end opposite the first end, the first end of the clip being coupled to the electronics unit and the second end of the clip being coupled to the cell connector; and
an intermediate piece comprising a second metal that is different than the first metal, one side of the intermediate piece being coupled to the first end of the clip and another side of the intermediate piece being coupled to the electronics unit using SMD technology.

* * * * *